(12) United States Patent
Lee (10) Patent No.: US 11,143,903 B2
(45) Date of Patent: Oct. 12, 2021

(54) DISPLAY APPARATUS

(71) Applicant: SAMSUNG ELECTRONICS CO., LTD., Suwon-si (KR)

(72) Inventor: Kye Hoon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/958,376

(22) PCT Filed: Nov. 30, 2018

(86) PCT No.: PCT/KR2018/015133
§ 371 (c)(1),
(2) Date: Jun. 26, 2020

(87) PCT Pub. No.: WO2019/132278
PCT Pub. Date: Jul. 4, 2019

(65) Prior Publication Data
US 2021/0088836 A1 Mar. 25, 2021

(30) Foreign Application Priority Data
Dec. 27, 2017 (KR) .......................... 10-2017-0180564

(51) Int. Cl.
*G02F 1/1335* (2006.01)
*G02F 1/1333* (2006.01)

(52) U.S. Cl.
CPC .. *G02F 1/133524* (2013.01); *G02F 1/133308* (2013.01); *G02F 1/133331* (2021.01)

(58) Field of Classification Search
CPC ............................................... G02F 1/133524
See application file for complete search history.

(56) References Cited

U.S. PATENT DOCUMENTS

| 7,566,588 B2 | 7/2009 | Kameyama et al. |
| 2014/0233239 A1* | 8/2014 | Matsuda ................... F21V 1/16 362/294 |
| 2015/0091028 A1* | 4/2015 | Lee ...................... G02B 6/0023 257/89 |

FOREIGN PATENT DOCUMENTS

| EP | 2 523 230 A2 | 11/2012 |
| EP | 2 853 808 A2 | 4/2015 |

(Continued)

OTHER PUBLICATIONS

International Search Report dated Mar. 15, 2019 issued by the International Searching Authority in counterpart International Application No. PCT/KR2018/015133 (PCT/ISA/210).

(Continued)

*Primary Examiner* — Edmond C Lau
(74) *Attorney, Agent, or Firm* — Sughrue Mion, PLLC (57) ABSTRACT

The present disclosure relates to a display apparatus including a display panel, a light guide plate disposed in the rear of the display panel, and at least one light source package disposed on one side of the light guide plate to supply light. The light source package includes a light source generating light, a package housing disposed to be spaced apart from a circumference of the light source, an encapsulation member disposed between the light source and the package housing and having an accommodation space on one side thereof, and a cover glass disposed in the accommodation space to face a light exit surface of the light source and configured to be equal to or larger than an area of the light exit surface.

11 Claims, 5 Drawing Sheets

(56) References Cited

FOREIGN PATENT DOCUMENTS

| JP | 2010-157638 A | 7/2010 |
| KR | 10-2013-0027611 A | 3/2013 |
| KR | 10-2014-0086932 A | 7/2014 |
| KR | 10-1501020 B1 | 3/2015 |
| KR | 10-2015-0035065 A | 4/2015 |
| WO | 2011/125428 A1 | 10/2011 |
| WO | 2016/190207 A1 | 12/2016 |

OTHER PUBLICATIONS

Communication dated Jan. 18, 2021 by the European Patent Office in corresponding European Application No. 18893598.5.

* cited by examiner

DISPLAY APPARATUS

CROSS-REFERENCE TO RELATED APPLICATIONS

This application is a National Stage of International Application No. PCT/KR2018/015133, filed Nov. 30, 2018, claiming priority based on Korean Patent Application No. 10-2017-0180564, filed Dec. 27, 2017, the contents of all of which are incorporated herein by reference in their entirety.

TECHNICAL FIELD

The present disclosure relates to a display apparatus, and more particularly, to a display apparatus with improved light source structure.

BACKGROUND ART

In general, a display apparatus is a device for displaying an image, such as a monitor or a television. A self-light emitting display panel, such as an organic light-emitting diode (OLED), or a light-receiving/emitting display panel, such as a liquid crystal display (LCD) panel, is used in a display apparatus.

The present disclosure relates to a display module and display apparatus to which a light-receiving/emitting display panel is applied. The display apparatus to which a light-receiving/emitting display panel is applied includes a display panel consisting of a liquid crystal panel and displaying an image, and a backlight unit supplying light to the display panel, and the backlight unit includes a light source module having a light source package, a light guide panel receiving light from the light source package and emitting the light to the display panel, and a plurality of optical sheets through which light passed through the light guide plate passes. The optical sheet may be composed of a reflective sheet, a light guide plate or a diffusion sheet and a prism sheet, a diffusion sheet, a polarizing sheet, and the like.

As described above, light generated from the light source package directs to the display panel through the light guide plate. A lot of heat is generated in the light source package by the light generated from light sources. The generated heat affects the light source package, such as shape deformation of some components. Deformation or damage of the light source package may reduce light source efficiency and life time of the light source package.

DISCLOSURE

Technical Problem

The present disclosure is directed to providing a display apparatus with improved heat resistance.

The present disclosure is directed to providing a display apparatus with improved light efficiency.

The present disclosure is directed to providing a display apparatus with improved color reproducibility.

Technical Solution

One aspect of the present disclosure provides a display apparatus including a display panel, a light guide plate disposed in the rear of the display panel, and at least one light source package disposed on one side of the light guide plate to supply light, wherein the light source package includes a light source generating light, a package housing disposed to be spaced apart from a circumference of the light source, an encapsulation member disposed between the light source and the package housing and having an accommodation space on one side thereof and a cover glass disposed in the accommodation space to face a light exit surface of the light source and configured to be equal to or larger than an area of the light exit surface.

The cover glass may cover the light exit surface to allow light emitted from the light exit surface to be transmitted.

The light source package may further include an expansion encapsulation member disposed in the accommodation space and formed in an outward direction thereof from a circumference of the cover glass.

The cover glass may be formed of a material having greater heat resistance than the encapsulation member and the expansion encapsulation member.

The expansion encapsulation member may be configured to cover the light source and the encapsulation member together with the cover glass.

The light source package may further include an adhesive member disposed between the cover glass and the light source such that the cover glass and the light source are to be in contact with each other.

The adhesive member and the expansion encapsulation member may be formed of the same material.

One surface of the cover glass may be connected to the light source by the adhesive member, and the circumference of the cover glass may be connected to the package housing by the expansion encapsulation member.

The cover glass may be configured such that the other surface opposite to the one surface facing the light exit surface faces one side of the light guide plate.

The cover glass may be formed smaller than a width of the package housing.

The encapsulation member may include a partition surface partitioning the accommodation space, and the partition surface may be configured to be inclined in a light emission direction as the partition surface is further away from the light source.

The cover glass may be formed of a heat-resistant glass material.

Another aspect of the present disclosure provides a display apparatus including a display panel, a light guide plate disposed in the rear of the display panel, and at least one light source package disposed on one side of the light guide plate to supply light, wherein the light source package includes a light source having an exit surface facing the light guide plate, and a cover glass formed to cover the light exit surface and having an incidence surface facing the light exit surface, the incidence surface being equal to or larger than the light exit surface.

The cover glass may be disposed such that one surface thereof faces the light exit surface and the other surface thereof faces one side of the light guide plate.

The light source package may further include a package housing disposed to be spaced apart from a circumference of the light source, an encapsulation member disposed between the light source and the package housing, and an expansion encapsulation member disposed between a circumference of the cover glass and the package housing.

The cover glass may be formed of a material having greater heat resistance than the encapsulation member and the expansion encapsulation member.

The expansion encapsulation member may be configured to cover the light source and the encapsulation member together with the cover glass.

The light source package may further include an adhesive member disposed between the cover glass and the light source such that the cover glass and the light source are to be in contact with each other, and the adhesive member may be formed of the same material as the expansion encapsulation member.

Advantageous Effects

According to an aspect of the present disclosure, heat resistance of a light source module can be unproved through a cover glass.

According to an aspect of the present disclosure, long-term quality identity can be provided by extending the life time of the light source module.

According to an aspect of the present disclosure, brighter light can be supplied to a display apparatus by improving the heat resistance of the light source module.

MODE OF THE INVENTION

The embodiments described in the present specification and the configurations shown in the drawings are only examples referred embodiments of the present disclosure, and various modifications may be made at the time of filing of the present disclosure to replace the embodiments and drawings of the present specification.

Like reference numbers or signs in the various drawings of the application represent parts or components that perform substantially the same functions.

The terms used herein are for the purpose of describing the embodiments and are not intended to restrict and/or to limit the present disclosure. For example, the singular expressions herein may include plural expressions, unless the context clearly dictates otherwise. Also, the terms "comprises" and "has" are intended to indicate that there are features, numbers, steps, operations, elements, parts, or combinations thereof described in the specification, and do not exclude the presence or addition of one or more other features, numbers, steps, operations, elements, parts, or combinations thereof.

It will be understood that, although the terms first, second, etc. may be used herein to describe various components, these components should not be limited by these terms. These terms are only used to distinguish one component from another. For example, without departing from the scope of the present disclosure, the first component may be referred to as a second component, and similarly, the second component may also be referred to as a first component. The term "and/or" includes any combination of a plurality of related items or any one of a plurality of related items.

Hereinafter, embodiments of the present disclosure will be described in detail with reference to the accompanying drawings.

Figure 1:
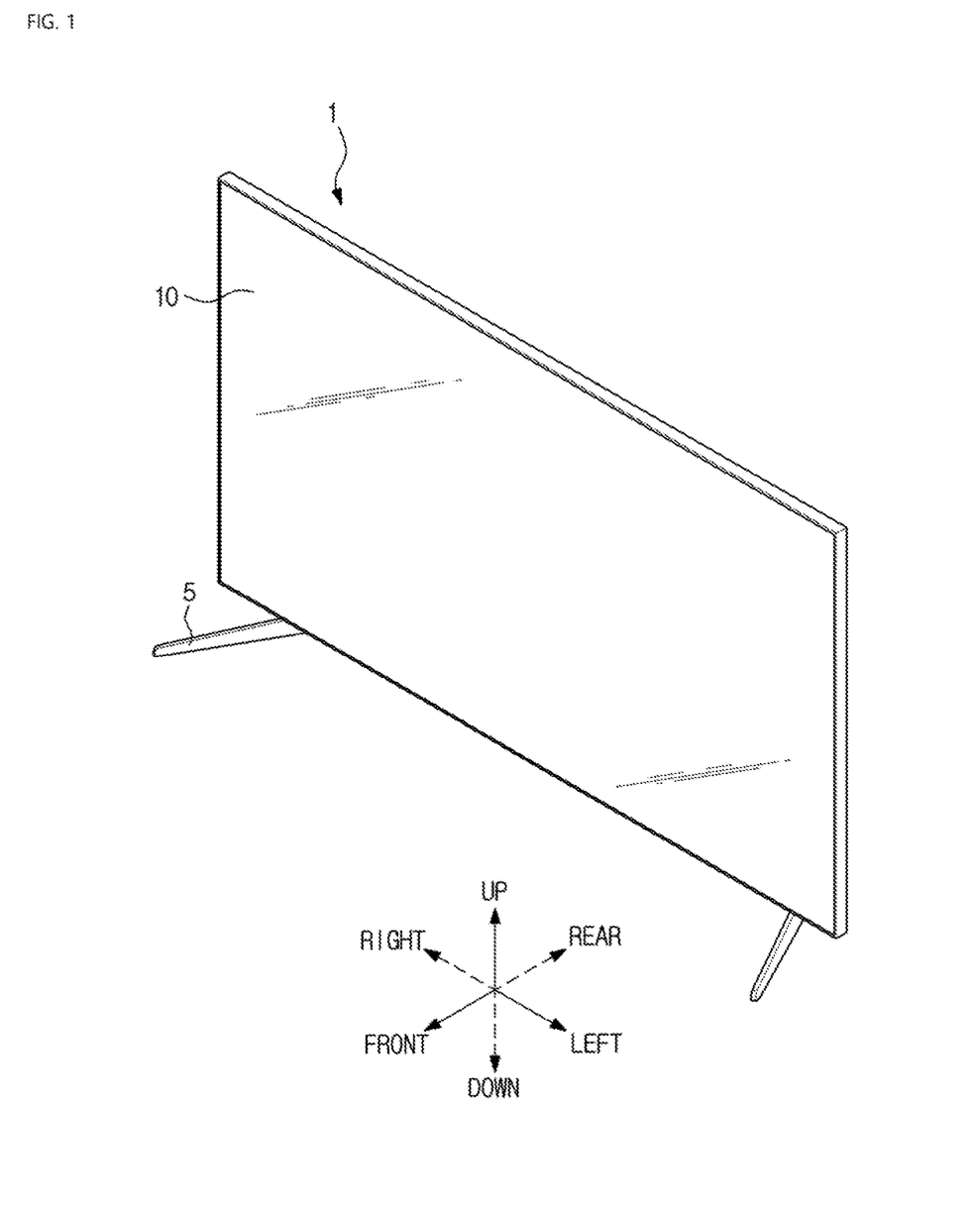
FIG. 1 is as perspective view of a display apparatus according to an embodiment of the present disclosure.
Figure 2:
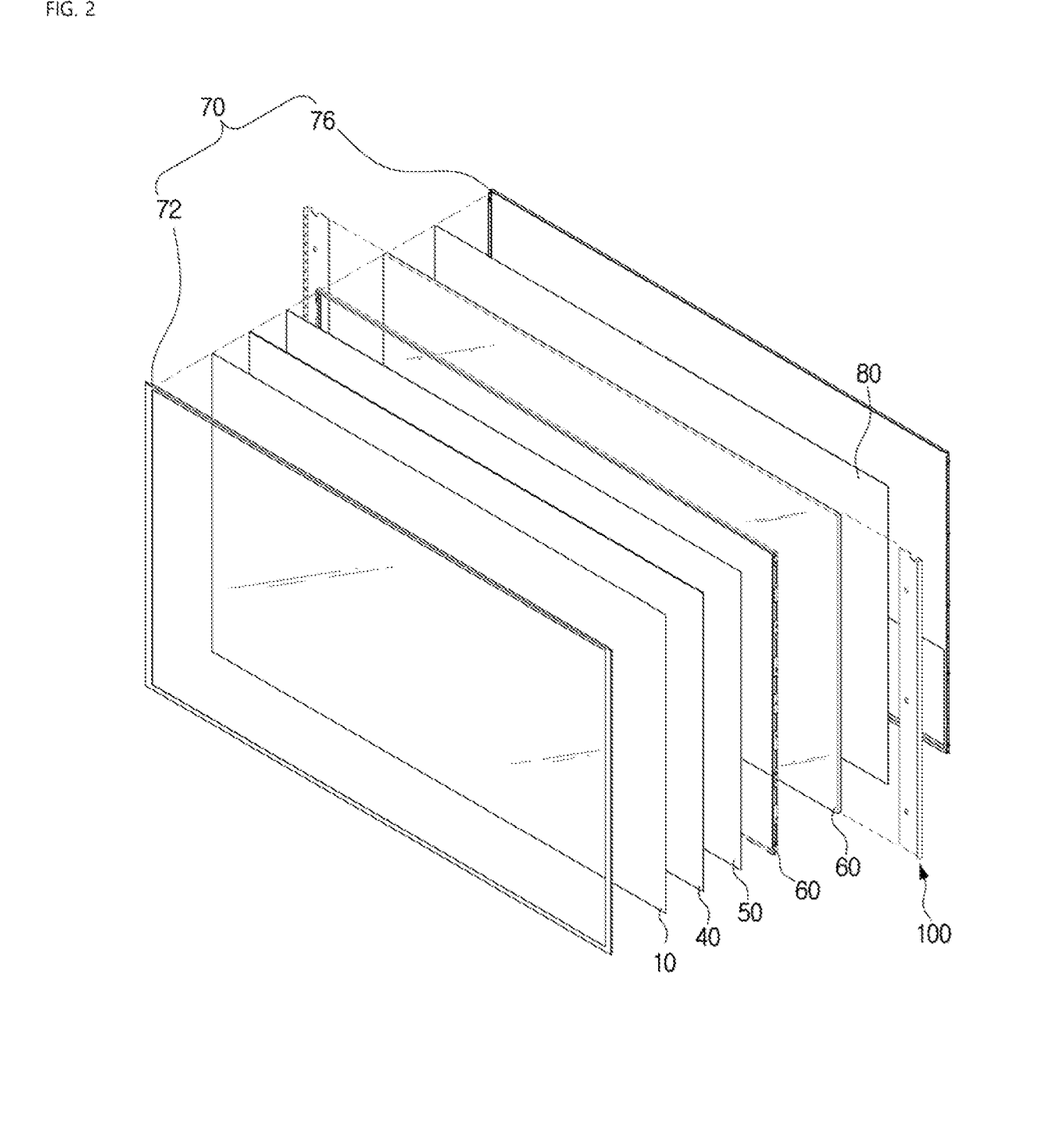
FIG. 2 is an exploded perspective view of the display apparatus according to an embodiment of the present disclosure.
Figure 3:
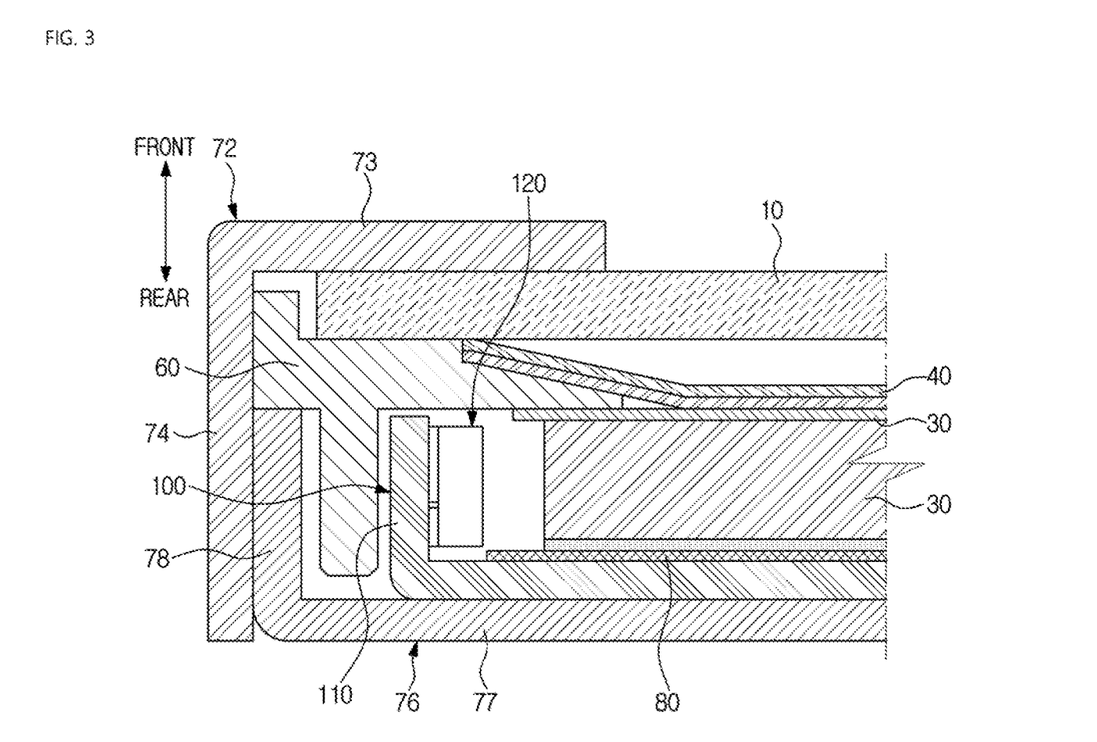
FIG. 3 is a cross-sectional view of the display apparatus according to an embodiment of the present disclosure.

FIG. 1 is a perspective view of a display apparatus according to an embodiment of the present disclosure, FIG. 2 is an exploded perspective view of the display apparatus according to an embodiment of the present disclosure, and FIG. 3 is a cross-sectional view of the display apparatus according to an embodiment of the present disclosure.

The present disclosure illustrates a flat display apparatus 1 as an example, but may be implemented as a curved display apparatus including a screen having a fixed curvature and a variable display apparatus capable of changing the curvature of a screen as well as the flat display apparatus 1, and it will be readily understood by those skilled in the art that the present disclosure is not limited thereto.

The display apparatus 1 includes a display module therein to display an image. The display apparatus 1 may include a support 5 for supporting the display module on a bottom surface. The present embodiment illustrates that the display apparatus 1 of a stand type is supported on the bottom surface by the support 5, but is not limited thereto. As an example, the present embodiment may be applied to the display apparatus 1 of a wall-mounted type to be mounted on a wall surface.

The display module includes a display panel 10 on which an image is displayed, and a backlight unit 20 configured to supply light to the display panel 10. The backlight unit 20 may be configured to transmit light in a surface direction to the display panel 100. The backlight unit 20 may include a light source module 100, a light guide plate 30, and an optical sheet 40. That is the backlight unit 20 may include the light source module 100 disposed in the rear of the display panel 10, the light guide panel 30 disposed in a space between the display panel 10 and the light source module 100 such that light supplied from the light source module 100 is diffused and transmitted to the display panel 10 positioned at a front side thereof, and the optical sheet 40 disposed between the display panel 10 and the light source module 100 to change optical properties. The display apparatus 1 may include a middle mold 60 configured to support the display panel 10, and a display chassis 70 forming an outer appearance. The display chassis 70 includes a top chassis 72 coupled to a front side of the middle mold 60 to maintain a state in which the display panel 10 is installed on the middle mold 60, and a bottom chassis 76 coupled to a rear side of the middle mold 60 and in which the light source module 100 is disposed on opposite sides thereof.

The light source module 100 may be disposed in the front of the bottom chassis 76 to emit light toward the display panel 10. The light source module 100 may include a light emitting device emitting blue light. The blue light may be converted into at least one of red light, green light, and blue light by a light conversion material, which will be described later. The present disclosure describes an embodiment applied to an edge display manner, but is not limited thereto and may be applied to a direct display manner.

The display panel 10 and the top chassis 72 are sequentially installed on the front side of the middle mold 60, and the bottom chassis 76 is installed on the rear side of the middle mold 60, so that the respective components are not only supported by the middle mold 60, but also the display panel 10 and the bottom chassis 76 are maintained in a state of being spaced apart from each other.

The top chassis 72 includes a bezel portion 73 covering a front outer edge of the display panel 10, and a top side portion 74 bent backward from an end of the bezel portion 73 to cover a side surface of the middle mold 60.

The bottom chassis 76 includes a rear side portion 77 forming a rear surface of the display module, and a bottom side portion 78 extending forward from an edge of the rear side portion 77 and coupled to the inside of the middle mold 60. The bottom chassis 76 is formed in a high strength polygonal plate shape and may include a metal material (for example, aluminum or aluminum alloy, etc.) with less thermal deformation due to heat generated by a light source 130 received therein and/or the display panel 10. The bottom chassis 76 may be formed of plastic (for example, polycarbonate (PC)) or plastic material to which glass fiber is added.

A reflective sheet 80 reflects light emitted from the light source module 100 toward the display panel 10, or reflects light reflected back by the optical sheet 40 or the display panel 10 toward the display panel 10 again. The reflective sheet 80 is disposed on a front surface of a printed circuit board 110 and reflects leaked light in a display panel 10 direction to improve light efficiency. The reflective sheet 80 may be disposed between the light guide plate 30 and the bottom chassis 76. The reflective sheet 80 may be coated with a white or silver high-reflective coating agent (e.g., silver, TiO2). The reflective sheet 80 may include a reflective plate.

The optical sheet 40 may allow light emitted from the light source module 100 toward the display panel 10 to have a uniform luminance. Light of uniform luminance passed through the optical sheet 40 is incident on the display panel 10. The optical sheet 40 may include a protective sheet, a prism sheet, or a diffuser sheet. The optical sheet may include at least one sheet.

A light conversion sheet 50 may be configured such that light passed through the light guide plate 30 is emitted through the light conversion sheet 50. The light conversion sheet 50 may be disposed in close contact with the light guide plate 30 on a front surface of the light guide plate 30. The light conversion sheet 50 is in close contact with the front surface of the light guide plate 30 such that light emitted from the light guide plate 30 passes therethrough.

Because the light of the LED reaches the light conversion sheet 50 through the light guide plate 30, the light conversion sheet 50 has little influence of heat from the LED and may easily secure reliability.

Figure 4:
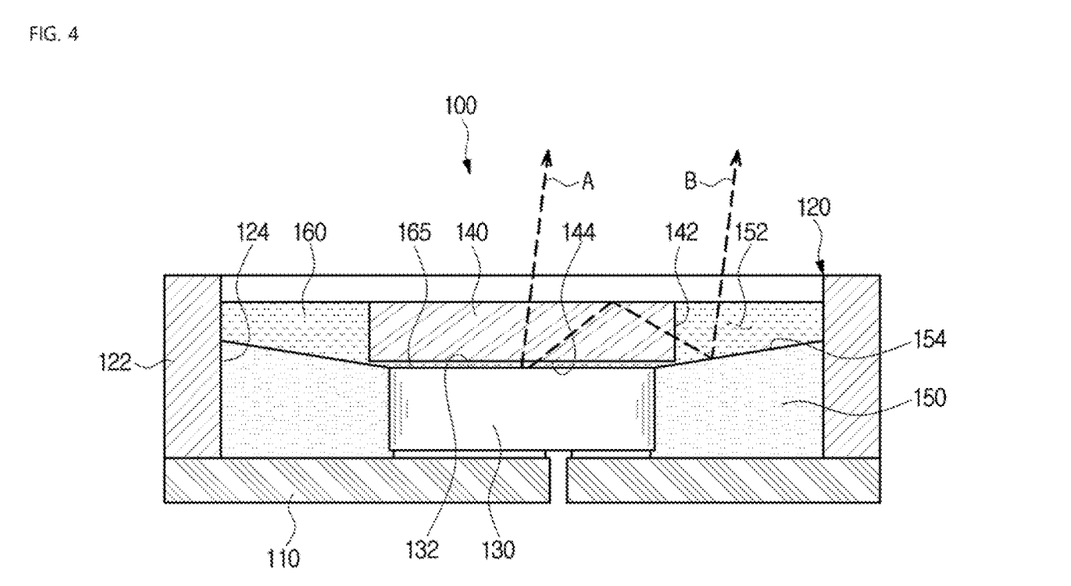
FIG. 4 is a cross-sectional view of a light source module of the display apparatus according to an embodiment of the present disclosure.

FIG. 4 is a cross-sectional view of a light source module of the display apparatus according to an embodiment of the present disclosure.

The light source module 100 may include a light source package 120 and the printed circuit board 110.

A plurality of the light source packages 120 may be mounted on the printed circuit board 110. A size of the printed circuit board 110 may correspond to a vertical length of the display panel 10. The present embodiment illustrates that the plurality of light source packages 120 are arranged to correspond to a vertical height of the display apparatus 1, but the arrangement of the plurality of light source packages 120 is not limited thereto.

The plurality of light source packages 120 may be arranged to be spaced apart from each other on the printed circuit board 110.

The light source package 120 may include a package housing 122. The light source 130 and a cover glass 140, which will be described later, may be disposed inside the package housing 122. The package housing 122 may be configured such that one side thereof is opened toward the light guide plate 30.

The light source 130 may be disposed inside the package housing 122. The package housing 122 may be disposed on the printed circuit board 110. The package housing 122 may be disposed around the light source 130 to reflect light. A reflective layer reflecting light may be formed on an inner surface of the package housing 122. The reflective layer may be formed to reflect light on an optical path of the light source 130.

The package housing 122 may be formed by selecting one or more of epoxy resin composition, silicone resin composition, modified epoxy resin composition, modified silicone resin composition, polyimide resin composition, modified polyimide resin composition, polyphthalamide (PPA), polycarbonate resin, polyphenylene sulfide (PPS), liquid crystal polymer (LCP), ABS resin, phenol resin, acrylic resin, PBT resin, a Bragg reflective layer, an air gap, a total reflection layer, a metal layer, and combinations thereof. Also, the package housing 122 may be formed by selecting one or more of EMC in which at least reflective material is included, white silicon in which reflective material is included, PSR (Photoimageable Solder Resist), and combinations thereof.

The light source package 120 may include the light source 130 generating light. The light source 130 may be disposed at the center of the light source package 120 and may be disposed to be spaced apart from the package housing 122 by a predetermined distance. The light source 130 may include a light emitting device (LED). A plurality of the light sources 130 may be provided, and the plurality of light sources 130 may be arranged to be spaced apart from each other by a predetermined distance. The light source 130 may include a blue light emitting device. The blue light emitted from the light source 130 may be converted into white light by the light conversion material, which will be described later.

As light generated from the light source 130 passes through a light conversion unit or a light conversion film, the properties of the light change. In detail, the light conversion unit or the light conversion film is configured to change the wavelength of light. The light conversion material may be configured together in the light source package 120 or may be disposed on the optical path in the form of a sheet. The present embodiment illustrates and explains that the light conversion sheet 50, which is formed in a sheet shape as a light conversion material, is disposed on an exit surface of the light guide plate 30, but is not limited thereto, and it is sufficient as long as the light conversion material is disposed on an optical path through which light is emitted from the light source 130 and emitted to the outside of the display apparatus 1.

The light conversion material may include a quantum dot (QD). Normally, when an electron receives energy, the electron in a valence band is excited to a conduction band. After that, the electron loses energy again and falls to the valence band, which has the property of emitting energy as light. The quantum dot generates strong fluorescence in a narrow wavelength band. Depending on a size of the quantum dot, all colors of visible light may be generated. Also, because the quantum dot itself generates natural color, it is a material that does not lose color and has high color reproducibility. The quantum dot generates light of a shorter wavelength as a particle thereof is smaller and generates light of a longer wavelength as the particle thereof is larger. The light conversion material may be a compound of quantum dot cadmium sole tide (Cdse), cadmium sulfide (Cds), cadmium telluride (Cdte), zinc selenide (ZnSe), zinc tellenide (ZnTe), zinc sulfide (ZnS), and the like.

The light source package 120 may include the cover glass 140 disposed on one side of the light source 130. The cover glass 140 may be disposed to cover one side surface of the light source 130. The light source 130 emits light through a light exit surface 132, and the cover glass 140 may be configured to cover the light exit surface 132. The cover glass 140 may be provided to be larger than the light source 130. In detail, a surface 144 of the cover glass 140 facing the light source 130 may be formed to be equal to or larger than an area of the light exit surface 132 of the light source 130. The cover glass 140 may have a width smaller than a width formed by the package housing 122. The cover glass 140 may be formed such that one surface thereof faces one side of the light guide plate 30 and the other surface 144 thereof faces the light exit surface 132.

In a process of emitting light from the light source 130, heat is accumulated in the light source package 120 to increase a temperature therein. When the light source package 120 maintains a high temperature, the material or shape of components therein is deformed, resulting in poor durability.

The cover glass 140 may be configured to cover the light exit surface 132 of the light source 130 to allow heat generated from the light exit surface to be transferred. Because the cover glass 140 is configured to have higher heat resistance than an encapsulation member 150 and/or an expansion encapsulation member 160, the light source package 120 may improve durability compared to a case when the cover glass 140 is not adopted.

The light source package 120 may include the encapsulation member 150 disposed between the light source 130 and the package housing 122. The encapsulation member 150 is disposed between the light source 130 and the package housing 122 to prevent damage to internal components by absorbing external impacts. The encapsulation member 150 may be formed of a permeable material. The encapsulation member 150 may be filled between the light source 130 and the package housing 122 in a fluid state and may be cured. The encapsulation member 150 may form an accommodation space 152 on one side thereof. In the accommodation space 152 formed by the encapsulation member 150, the cover glass 140 and the expansion encapsulation member 160, which will be described later, may be disposed. The encapsulation member 150 may include a partition surface 154 partitioning the accommodation space 152 on one side surface thereof.

The partition surface 154 may be inclined to be closer to the light guide plate 30 as it is further away from the light source 130. That is, referring to FIG. 4, the partition surface 154 may be configured to be inclined toward an upper side as it is further away from the light source 130. Through this configuration, light totally reflected toward the partition surface 154 in light emitted from the light source 130 may be reflected hack toward the light guide plate 30.

The light source package 120 may include the expansion encapsulation member 160.

The expansion encapsulation member 160 may be formed in a direction extending from a circumference of the cover glass 140. The expansion encapsulation member 160 may be disposed in the accommodation space. The expansion encapsulation member 160 may be formed in an outward direction thereof from a circumference 142 of the cover glass 140. The expansion encapsulation member 160 may be disposed to connect the circumference 142 of the cover glass 140 and an inner side surface 124 of the package housing 122. The expansion encapsulation member 160 is disposed in the accommodation space 152 together with the cover glass 140 and may be in contact with the partition surface 154. That is, the expansion encapsulation member 160 may be configured to cover the light source 130 and the encapsulation member 150 together with the cover glass 140.

Light totally reflected from the front surface of the cover glass 140 in light generated from the light source 130 may pass through the expansion encapsulation member 160 and be reflected by the partition surface 154, and then proceed toward the light guide plate 30. The expansion encapsulation member 160 may be configured such that a light path through which light passes through the cover glass 140 is expanded.

The expansion encapsulation member 160 is configured together with the cover glass 140 such that light generated from the light source 130 may be transmitted and reflected, and then proceed toward the light guide plate 30. To this end, the expansion encapsulation member 160 may be formed of a light transmissive material. The material of the expansion encapsulation member 160 is not limited. As an example, the expansion encapsulation member 160 may include a silicon material.

The light source package 120 may include an adhesive member 165.

The adhesive member 165 may be disposed between the cover glass 140 and the light source 130 to allow the cover glass 140 and the light source 130 to be in contact with each other. As the adhesive member 165 is disposed between the cover glass 140 and the light source 130, the adhesive member 165 may maintain a stable shape without deformation of the shape even when hot heat is transferred by the light source 130.

The adhesive member 165 and the expansion encapsulation member 160 may be formed of the same material. The adhesive member 165 may have a thickness of 50 μm or less. However, the material and thickness of the adhesive member 165 are not limited.

The adhesive member may improve adhesion by being in close contact with both the cover glass 140 and the light source 130. Also, the adhesive member may widen a surface area in contact between both the components, so that heat generated from the light source 130 may be easily transferred to the cover glass 140. The adhesive member 165 may be formed of the same material as the expansion encapsulation member 160 described above.

The one surface 144 of the cover glass 140 may be connected to the light source 130 by the adhesive member 165, the circumference 142 thereof may be connected to the package housing 122 by the expansion encapsulation member 160. Through this arrangement, the light generated from the light source 130 may pass only the cover glass 140 (A in FIG. 4) or pass through the cover glass 140 and the expansion encapsulation member 160 (B in FIG. 4), and then proceed toward the light guide plate 30. That is, all light generated by the light source 130 passes through the cover glass 140. In this process, because the cover glass 140 is formed of a heat-resistant glass material that does not undergo material or shape deformation at a temperature below a certain temperature, even when hot heat is generated from the light source 130 by continuous use, malfunction of the light source package 120 may be prevented. That is, the durability of the light source package 120 may be improved.

Hereinafter, a display apparatus according to another embodiment of the present disclosure will be described. Descriptions of components overlapping with those described above will be omitted.

Figure 5:
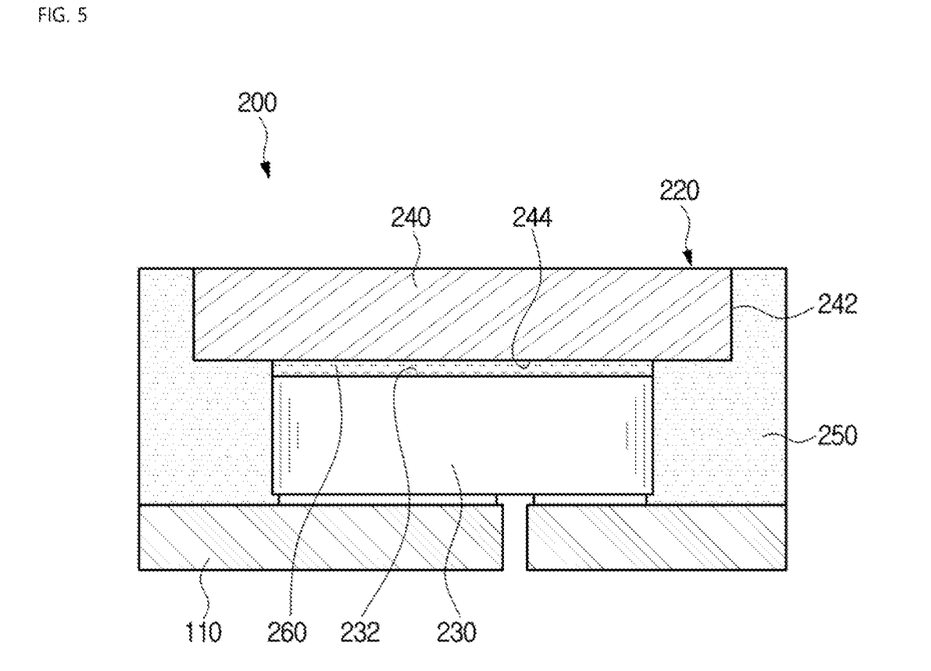
FIG. 5 is a cross-sectional view of a light source module of a display apparatus according to another embodiment of the present disclosure.

FIG. 5 is a cross-sectional view of a light source module of a display apparatus according to another embodiment of the present disclosure.

The light source module 200 may include a light source package 220 and the printed circuit board 110.

The light source package 220 may include a light source 230 generating light and a cover glass 240 disposed on one side of the light source 230.

The cover glass 240 may be disposed to cover one side surface of the light source 230. An adhesive member 265 may be disposed between the cover glass 240 and the light source 230 to allow the cover glass 240 and the light source 230 to be in contact with each other.

The light source 230 emits light through a light exit surface 232, and the cover glass 240 may be configured to cover the light exit surface 232. The cover glass 240 may be provided to be larger than the light source 230. In detail, a surface 244 of the cover glass 240 facing the light source 230 may be formed to be equal to or larger than an area of the light exit surface 232 of the light source 230. The cover glass 240 may have a width smaller than a width formed by a package housing 222. The cover glass 240 may be formed such that one surface thereof faces one side of the light guide plate 30 and the other surface 244 thereof faces the light exit surface 232.

In a process of emitting light from the light source 230, heat is accumulated in the light source package 220 to increase a temperature therein. When the light source package 220 maintains a high temperature, the material or shape of components therein is deformed, resulting in poor durability.

The cover glass 240 may be configured to cover the light exit surface 232 of the light source 230 to allow heat generated from the light exit surface to be transferred. Because the cover glass 240 is configured to have higher heat resistance than an encapsulation member 250, the light source package 220 may improve durability compared to a case where the cover glass 240 is not adopted.

While the present disclosure has been particularly described with reference to exemplary embodiments, it should be understood by those of skilled in the art that various changes in form and details may be made without departing rom the spirit and scope of the present disclosure.

The invention claimed is:

1. A display apparatus comprising:
a display panel;
a light guide plate disposed in the rear of the display panel; and
at least one light source package disposed on one side of the light guide plate to supply light,
wherein the at least one light source package comprises:
a light source configured to generate light;
a package housing spaced apart from a circumference of the light source;
an encapsulation member disposed between the light source and the package housing and having an accommodation space on one side thereof; and
a cover glass disposed in the accommodation space to face a light exit surface of the light source and configured to be equal to or larger than an area of the light exit surface,
wherein the at least one light source package further comprises an expansion encapsulation member disposed in the accommodation space and formed in an outward direction thereof from a circumference of the cover glass.

2. The display apparatus according to claim 1, wherein the cover glass covers the light exit surface to allow light emitted from the light exit surface to be transmitted.

3. The display apparatus according to claim 1, wherein the cover glass is formed of a material having greater heat resistance than the encapsulation member and the expansion encapsulation member.

4. The display apparatus according to claim 1, wherein the expansion encapsulation member is configured to cover the light source and the encapsulation member together with the cover glass.

5. The display apparatus according to claim 1, wherein the at least one light source package further comprises an adhesive member disposed between the cover glass and the light source such that the cover glass and the light source are to be in contact with each other.

6. The display apparatus according to claim 5, wherein the adhesive member and the expansion encapsulation member are formed of the same material.

7. The display apparatus according to claim 5, wherein one surface of the cover glass is connected to the light source by the adhesive member, and the circumference of the cover glass is connected to the package housing by the expansion encapsulation member.

8. The display apparatus according to claim 7, wherein the cover glass is configured such that another surface opposite to the one surface facing the light exit surface faces one side of the light guide plate.

9. The display apparatus according to claim 1, wherein the cover glass is formed smaller than a width of the package housing.

10. The display apparatus according to claim 1, wherein the encapsulation member comprises a partition surface partitioning the accommodation space, and the partition surface is configured to be inclined in a light emission direction as the partition surface is further away from the light source.

11. The display apparatus according to claim 1, wherein the cover glass is formed of a heat-resistant glass material.

* * * * *